United States Patent [19]

Weinert et al.

[11] 3,975,679
[45] Aug. 17, 1976

[54] DIRECT-READING SWEPT-FREQUENCY SLOTTED LINE SYSTEM WITH SLOPE CORRECTION

[75] Inventors: Fritz K. Weinert; Bruno O. Weinschel; Donald Woodruff, all of Gaithersburg, Md.

[73] Assignee: Weinschel Engineering Co., Inc., Gaithersburg, Md.

[22] Filed: June 16, 1975

[21] Appl. No.: 587,389

[52] U.S. Cl............................................ 324/58.5 B
[51] Int. Cl.²......................................... G01R 27/04
[58] Field of Search ........ 324/58.5 B, 58 B, 58.5 A, 324/58 A

[56] References Cited
UNITED STATES PATENTS
3,693,078 9/1972 Sorger.............................. 324/58 B

*Primary Examiner*—Stanley T. Krawczewicz
*Attorney, Agent, or Firm*—Max L. Libman

[57] ABSTRACT

A swept-frequency VSWR measurement system for slotted lines is disclosed in which the measurement values are rapidly produced as a graph of VSWR versus frequency over a range of 2–18 GHz, in which the VSWR is given directly by the height of the ordinate at any frequency without requiring subtraction of two values derived from graph measurements as previously done. In addition, a "slope" correction is continuously made for errors introduced by physical imperfections of the slotted line, simultaneously with the taking of the swept frequency measurement.

8 Claims, 4 Drawing Figures

Typical Prior Art
Swept-Freq. VSWR Plot

Direct Reading VSWR Plot

DIRECT-READING SWEPT-FREQUENCY SLOTTED LINE SYSTEM WITH SLOPE CORRECTION

This invention is an improvement over that of U.S. Pat. No. 3,693,078 to G. U. Sorger, issued Sept. 19, 1972, for Swept Frequency VSWR Measurement with Slotted Line, which discloses a system which provides values of VSWR over a range of frequencies, but in the rather inconvenient graphic form of dual enveloped curves whose vertical separation represents the desired value, so that the desired difference cannot conveniently be read directly. The present invention provides a data output which can be read directly and is therefore more useful. Using a digital normalizer, as described more fully below, the lower envelope is made to coincide with the X axis, so that the upper envelope reads directly in VSWR.

One of the factors limiting accuracy of the coaxial slotted line is the straightness which can be achieved for the center conductor and the bore. Small eccentricities along the length of the line, while having little effect on the characteristic impedance of the line, do affect the coupling of the signal probe to the carriage. This is known as the slope error. In the swept-frequency slotted-line method, it is an important source of error. Furthermore, the connection of the signal generator cable connector and of the test specimen can exert axial and radial forces on the center conductor, causing it to bow slightly and distorting the center conductor probe-coupling profile along the slotted line. In the VSWR measuring system of the present invention, this coupling profile is measured and corrected during the test, i.e., after all the connections have been made. The slope correction is performed automatically in real time, not during an earlier run when conditions may be different from those existing during the actual test run. It is performed by supplying a relatively low-frequency (e.g. 10 MHz) reference voltage during the off-period of a 100% square-wave modulated RF signal, or prior to each sweep of the RF sweep oscillator. This reference signal and the RF (high-frequency) test signal are thus interlaced, and are separately detected after coupling through the same capacity between the slotted line center conductor and the probe. The voltage distribution along the line for loads of standing-wave ratios (SWR's) less than 3.0, is flat within 0.1% for a 10 MHz reference signal, while the voltage distribution for the RF test signal exhibits the VSWR to be measured. Changes in the coupling capacitance between the slotted-line center conductor and the loosely coupled probe due to distance changes caused by an eccentric center conductor influence the pick-up of the 10 MHz reference signal in almost the same way as the RF test signal, so that the ratio of the separately detected signal is proportional to the RF voltage standing wave pattern and independent of the slope error.

The RF test and the 10 MHz reference signal are square-wave modulated in opposite phase at an audio frequency rate or may be applied prior to the sweep of the RF sweep oscillator. During the "on" cycle of the RF signal, and voltage picked up by the probe is rectified by a microwave diode detector operating in the square-law region and amplified in a logarithmic amplifier. The 10 MHz signal is extracted during its "on" period by forward biasing the microwave detector diode to a low resistance of about 100 ohms, or it may be extracted by using an AC forward bias to cause the microwave diode to behave as a mixer which produces an audio frequency IF signal. The signal of 10 MHz is amplified and rectified linearly and is then again amplified in a logarithmic amplifier. The outputs of the logarithmic amplifiers are synchronously detected and subtracted from each other.

The RF test voltage at the input of the microwave detector is $$V_{1s} = V_{siu} \left| \frac{1}{1 + 1/j\omega_s C Z_T} \right| \approx V_{siu} \omega_s C Z_T.$$

The 10-MHz reference voltage at the same point is $$V_{1R} = V_{ref} \left| \frac{1}{1 + 1/j\omega_R C Z_T} \right| \approx V_{ref} \omega_R C Z_T.$$

The output voltage of the synchronous detector caused by the RF test signal is $$V_s = a \log \frac{K_1 V_{1s}^2}{Z_T} = a \log \frac{K_1 \omega_s^2 C^2 Z_T^2 V_{siu}}{Z_T}$$

$$= 2a[\log K_{1\ 1/2} Z_{T\ 1/2} V_{siu} + \log \omega_s + \log C].$$

The output voltage of the other synchronous detector from the 10-MHz reference voltage is $$V_5 = b \log V_{1R} G = b \log V_{ref} \omega_R C Z_T G = b[\log (GV_{ref} Z_T) + \log \omega_R + \log C]$$

where $\omega C Z_T \ll 1$ and $a$, $b$, $K_1$, and $G$ are four proportional constants.

The gain constants of the both logarithmic amplifiers are set so that
$b = 2a.$

Then the output voltage $V_6$ becomes $$V_6 = V_3 - V_5 = 2a \left[ \tfrac{1}{2}\log \frac{K_1}{Z_T G^2} + \log \frac{V_{siu}}{V_{ref}} + \log \frac{\omega_s}{\omega_r} \right].$$

For any particular RF test frequency $\omega_s$ the output voltage $V_6$ is only a function of the RF test signal:

$$V_6 = K + 2a \log V_{siu}$$

where $$K = 2a[\tfrac{1}{2}\log (K_1/Z_T G^2) - \log V_{ref} + \log (\omega_s/\omega_r)].$$

Note that the output voltage is independent of changes of the coupling capacity $C$ and, therefore, independent of center conductor slope.

The specific nature of the invention, as well as other objects and advantages thereof, will clearly appear from a description of a preferred embodiment as shown in the accompanying drawings, in which.

Figure 1:
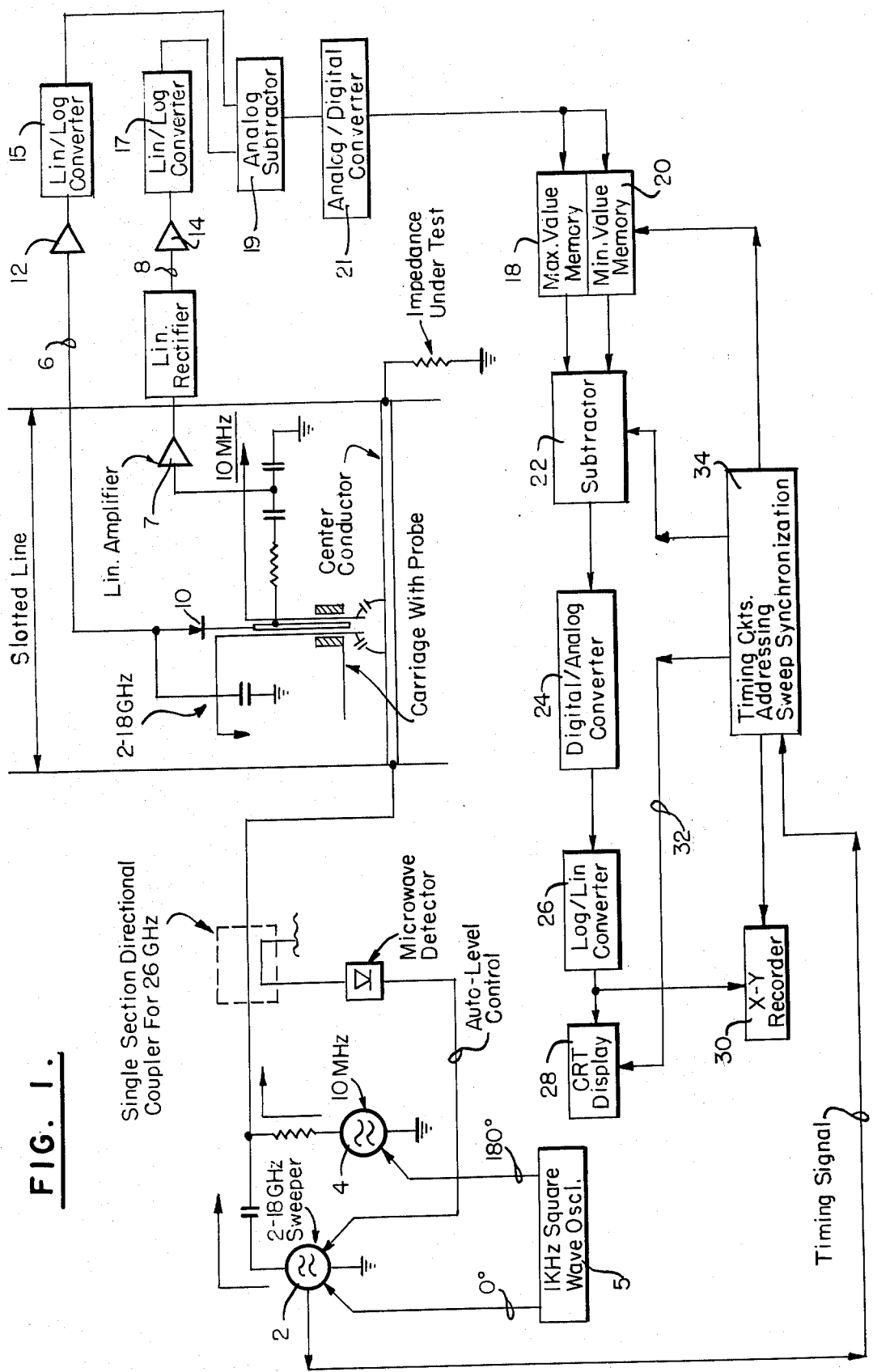
FIG. 1 is a block diagram showing the principle of the invention.

Referring to FIG. 1, signal generator 2 (2–18 GHz) sweeps the range of frequencies at which the measurement is to be made - for a given slotted line this will typically be in the range for which the slotted line is usable. Oscillator 4 (10 MHz) also feeds a signal onto the line. Both are square-wave modulated by 1 KHz square-wave oscillator 5 in such a way that one is on when the other is off, so that the two signals are interlaced and each is on for one-half the time. At the probe carriage the total signal is separated into its two components, each of which is fed into one of two separate lines 6 and 8. Detector 10 rectifies and picks up the high-frequency signal during the time when it is on. The coupling for the 10 MHz signal is very loose because of the low-frequency coupling capacitance between the probe and the center conductor, and represents a very high reactance so that the signal at 10 MHz is low, but it is immediately amplified at 7 to correct for this. A further amplifier is provided in each channel 6 and 8 as shown at 12 and 14 respectively. The output of amplifier 14 represents the slope correction, while the output of amplifier 12 represents the VSWR uncorrected for slope error.

The linear normalized display of this invention is, of course, independent of the slope correction and can be used without the slope correction feature, but of course the accuracy will not be as great. Conversely, the slope correction can be made independently of the normalized used here.

The VSWR value for a given frequency is generated by that frequency and depends on the impedance of the device under test. If the frequency is now changed, then for each frequency the VSWR pattern will be different. For practical use we want to know the VSWR at any frequency within the range in use. This VSWR depends on the values of the minimum and the maximum at that frequency. As described in prior U.S. Pat. No. 3,693,078, the generator is sweeping through the frequencies very fast and repeatedly at say 200 times for each movement of the carriage from one end to the other, in any event, very rapidly in comparison to the movement of the probe carriage so that at each position of the probe the entire frequency range is swept. In the display graph, the frequency is plotted as the abscissa (horizontal), so that now at any frequency the output signal goes through a certain range of output voltage values as the probe is moved. Considering only one frequency at a time, at this frequency the probe is moved along its entire length, and the maximum and minimum voltage values picked up during this movement are respectively stored in two memories 18 and 20. The outputs of these two memories are synchronized with the successive frequency values (not with the movement of the probe) and the memories 18 and 20 keep storing the highest and lowest values respectively that are put into them as the probe moves along the slot and finally wind up with the highest and lowest values that are entered into them as the probe moves from one end of the slotted line to the other at this one frequency we are considering, and these values are stored in the memory in a memory location or address corresponding to that frequency only. Of course, since the frequency is also varying rapidly at each position of the probe, as it moves relatively slowly along the slotted line, a similar maximum and minimum are stored in other memory addresses corresponding to other selected frequencies. In a practical device some 256 respective addresses of memory locations are provided corresponding to 256 frequency steps between the highest and the lowest frequencies of the frequency range being swept, and at any one instant the two outputs of the memories corresponding to the maximum and minimum values respectively stored for the one particular frequency of these 256 frequencies which the sweep generator is putting out at this instant as it sweeps through its gamut.

To display the above data in a linear form, the voltage values existing at any one instant on lines 6 and 8 are converted to a logarithmic value by the linear-logarithmic converters 15 and 17, and subtracted in analog subtractor 19 to give a value corresponding to the slope correction at each point in time, i.e. at each frequency of the sweep range as the probe is moved along its slot. This value is, of course, varying as the frequency varies, but at any given instant it represents the corrected voltage picked up by the probe; this voltage is converted to a digital value in analog-digital converter 21 and its output fed into the memories 18 and 20, as a number. As this number varies, its highest value for each frequency is stored in 18 and the lowest value in 20 at the memory address corresponding to each successive selected frequency for which an address is provided. These components 17–21 are standard circuit components now commercially available and need not be described in detail.

The minimum outputs of the memory are subtracted from its maximum outputs in subtractor 22, reconverted to analog values in converter 24, further converted to linear values in log-lin converter 26 and fed as ordinates (Y-values) to CRT display 28 and to X-Y recorder 30. The absicca values (X-scale) are supplied from suitable timing circuits 34 which synchronize the outputs of the memory storage devices 18 and 20, subtractor 22 and the display device and recorder with the output of sweep generator 2 so that at each X-value on the final record the proper Y-value is supplied.

Figure 2:
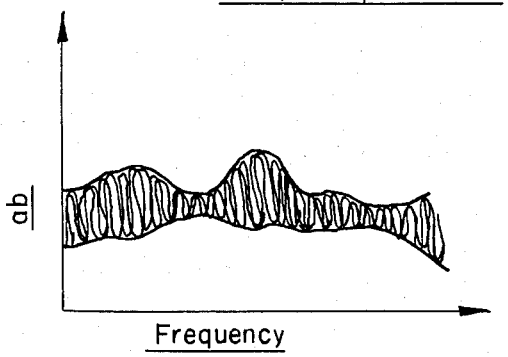
FIG. 2 is a graph showing a typical result produced by the prior art swept-frequency technique.
Figure 3:
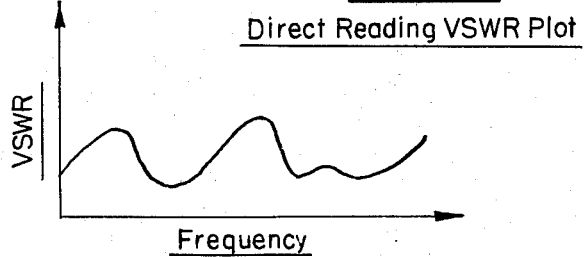
FIG. 3 is a typical graph produced by the present invention and FIG. 4 is a typical graph showing results obtained with the slope correction technique.

In order to show the improvement in result due to the abovedescribed system, reference is made to FIG. 2 showing a typical swept frequency VSWR plot made according to the system of the previously-referred to Patent. In this case, the vertical separation of the two envelops A and B is a function of the VSWR, while the X-axis represents frequency. It is therefore necessary to measure this separation, and even if a special instrument is provided for this purpose, it will be apparent that obtaining the desired value is somewhat tedious and inconvenient. On the other hand, FIG. 3 shows the normalized display graph resulting from the use of the present system. Since the lower envelope has been made to coincide with the X-axis, the upper envelope now reads VSWR directly. Furthermore, for production testing, a horizontal line can readily be drawn by mechanical or electronic means to distinguish the failure level beyond which the equipment being tested must be rejected, so that pass-fail condition is displayed directly and accurately.

Another advantage of the present method in production testing is its speed in comparison with some testing methods currently in use. Depending on the fineness of resolution desired, sweep test results may be obtained in as little as 10 seconds for a complete measurement an an additional 20 seconds to obtain a permanent X-Y record of the stored data.

Figure 4:
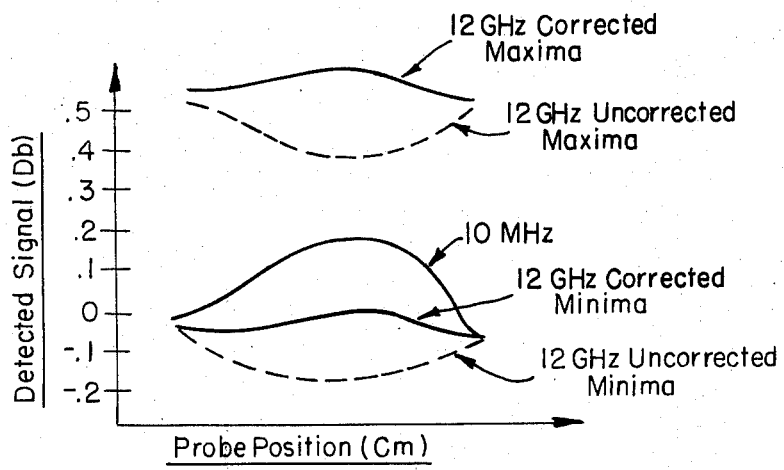

FIG. 4 shows the effectiveness of the automatic slope correction. The measurement was made at a frequency of 12 GHz. The voltage maximums and minimums were recorded versus probe position using the system with and without the 10-MHz reference signal. The VSWR of the test object is 1.062 corresponding to a ) .525-dB difference between maximum and minimum readngs. The change is maximum or minimum reading is about 0.1 dB without the error compensation corresponding to a residual slope error of VSWR = 1.012, and about 0.03 dB with error compensation corresponding to a residual slope error of VSWR of 1.0034.

We claim:

1. System for producing a direct VSWR reading over a continuous range of frequencies, comprising
   a. a measurement slotted line having a slidable test probe and detector, and means for connecting the slotted line to a unit to be tested,
   b. RF sweep generator means connected to said slotted line for repeatedly supplying said slotted line with electrical energy over said range of frequencies at a repetition rate such that substantially the entire said range of frequencies is swept through at closely spaced successive positions as the probe is moved along the slot,
   c. means for respectively storing maximum and minimum values picked up by the probe at each of said frequencies as the probe is moved along the slot, and
   d. means for displaying the difference between said maximum and minimum values for each of said specific frequencies.

2. The invention according to claim 1, and means for storing a quantity proportional to the voltage value picked up by the probe at a number of successive specific frequencies as the sweep generator output varies through its frequency gamut.

3. The invention according to claim 2, wherein said last named means comprise analog-digital converter means for converting the voltage value picked up by the probe to a corresponding number of digital values, each corresponding to the probe output at one of said frequencies.

4. The invention according to claim 1,
   e. and slope correction means comprising a relatively low-frequency generator also connected to the input of said slotted line, and means for interlacing the RF output of the sweep generator and the output of the low-frequency generator so that each is alternately supplied to said slotted line,
   f. means for separating the resulting high-frequency and low-frequency probe signals picked up by the probe,
   g. correction means connected to said converter means for producing a signal which is a function of the difference between said values, and is therefore a slope-corrected signal.

5. The invention according to claim 3,
   e. and slope correction means comprising a relatively low-frequency generator also connected to the input of said slotted line, and means for interlacing the RF output of the sweep generator and the output of the low-frequency generator so that each is alternately supplied to said slotted line,
   f. frequency selective means at the output of the probe for separating the resulting high-frequency and low-frequency probe signals picked up by the probe, and linear-logarithmic converter means for respectively converting said signals to logarithmic values,
   g. subtractor means connected to said converter means for producing a signal which is a function of the difference between said values and is therefore a slope-corrected signal,
   h. and means for supplying said last signal to said analog-digital converter.

6. System for producing a direct VSWR reading over a continuous range of frequencies, comprising
   a. a measurement slotted line having a slidable test probe and detector, and means for connecting the slotted line to a unit to be tested,
   b. RF sweep generator means connected to said slotted line for repeatedly supplying said slotted line with electrical energy over said range of frequencies at a repetition rate such that substantially the entire said range of frequencies is swept through at closely spaced successive positions as the probe is moved along the slot,
   c. slope correction means comprising a relatively low-frequency generator also connected to the input of said slotted line, and means for interlacing the RF output of the sweep generator and the output of the low-frequency generator so that each is alternately supplied to said slotted line,
   d. means for separating the resulting high-frequency and low-frequency probe signals picked up by the probe,
   e. and means for supplying said low-frequency probe signal as a slope correction factor to compensate for slope errors due to physical imperfection of the slotted line.

7. System for producing a direct VSWR reading over a continuous range of frequencies covering at least an octave, comprising
   a. a measurement slotted line having a slidable test probe and detector, and means for connecting the slotted line to a unit to be tested;
   b. sweep generator means for repeatedly supplying said slotted line with the electrical energy over said range of frequencies, at a repetition rate such that substantially the entire said range of frequencies is swept through at clearly spaced successive positions as the probe is moved along the slotted line;
   c. a converter unit connected to the probe of the slotted line for converting the output of said slotted line at a number of specific successive frequencies, as the sweep generator output varies through its frequency gamut, to a corresponding number of values;
   d. a maximum value memory storage device and a minimum value memory storage device both connected to the output of said converter unit and having a number of storage addresses corresponding to the number of said closely-spaced successive frequencies, so that they respectively store at said addresses the maximum and minimum value received from the converter at each of said frequencies as the probe is moved along the slotted line;
   e. computational means connected to said two memory storage devices for operating on said minimum value and said maximum value to produce a corrected value corresponding to the VSWR at each of said frequencies;
   f. converter means connected to said computational means for producing an output corresponding to said corrected value;
   g. and display means for displaying said corrected value.

8. The invention according to claim 7, wherein said converter unit is an analog-digital unit for converting the output of said slotted line to digital values, and wherein said computational means comprise subtractor means for subtracting said minimum value from said maximum value to produce a digital difference corrected value, and wherein said converter means comprise digital-converter means for producing an analog output corresponding to said digital difference, said system including display means for displaying said last analog value as ordinate at abscissa points on a graph corresponding to the frequency at which the max-min subtraction was made, and including also synchronous timing means for synchronizing the frequency output of the sweep generator with the memory and display circuits.

* * * * *